(12) United States Patent
Hsiao

(10) Patent No.: US 8,460,020 B2
(45) Date of Patent: Jun. 11, 2013

(54) THIN CARD CONNECTOR ADAPTED FOR THIN CARD

(75) Inventor: Hsueh-Lung Hsiao, New Taipei (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 55 days.

(21) Appl. No.: 13/191,427

(22) Filed: Jul. 26, 2011

(65) Prior Publication Data

US 2012/0034818 A1 Feb. 9, 2012

(51) Int. Cl.
*H01R 13/62* (2006.01)

(52) U.S. Cl.
USPC .......................................... 439/159; 439/630

(58) Field of Classification Search
USPC .................. 439/159, 188, 630, 626; 235/486, 235/492
See application file for complete search history.

(56) References Cited

U.S. PATENT DOCUMENTS

| 6,790,061 | B1 * | 9/2004 | Lai et al. ........................ 439/159 |
| 6,932,654 | B2 * | 8/2005 | Washino ........................ 439/630 |
| 7,048,588 | B2 * | 5/2006 | Chang ............................ 439/630 |
| 7,252,522 | B2 * | 8/2007 | Ooya et al. .................... 439/159 |
| 7,322,838 | B1 * | 1/2008 | Chen et al. .................... 439/159 |
| 7,326,071 | B1 * | 2/2008 | Ho et al. ........................ 439/159 |
| 7,503,782 | B2 * | 3/2009 | Chang ............................ 439/159 |
| 2008/0218799 | A1 | 9/2008 | Hiew et al. |

* cited by examiner

*Primary Examiner* — Thanh Tam Le
(74) *Attorney, Agent, or Firm* — Wei Te Chung; Ming Chieh Chang

(57) ABSTRACT

A thin card connector (100) includes an insulative housing (1) with a hollow (15) accommodating a thin card, a bottom wall of the insulative housing defining a card supporting surface (111) disposed under the hollow; a group of first terminals (21) having contacting portions (213) extending into the hollow, a group of second terminals (22) having contacting portions (223) extending into the hollow, the contacting portions of the first contacts located in front of contacting portions of the second terminals; and at least one guiding groove (113) defined in a front segment of the card supporting surface and disposed under the hollow, the guiding groove passing through a front end of the bottom wall to ventilate an exterior.

14 Claims, 6 Drawing Sheets

THIN CARD CONNECTOR ADAPTED FOR THIN CARD

FIELD OF THE INVENTION

The present invention relates to a card connector, especially to a thin card connector for connecting with a thin card.

DESCRIPTION OF RELATED ART

A card connector and a corresponding card is widely used for data storing. A typical card connector includes an insulative housing and a plurality of terminals supported by the insulative housing. The insulative housing defines a mating port for receiving the card. The terminals have contacting portions extending into the mating port for mating with contacts/conductive pads on the card. There are many different kinds of cards, such as SD card, MS card and MS Duo card, adapted for different electronic devices. While each of these cards has a pre-determined pads for interconnecting with those corresponding contacting portions and they are generally arranged in one row. The conductive pads occupy much space of the card, hence a transversal dimension of the card together with the card connector increase.

US Pub. Pat. No. 2008/0218799 published on Sep. 11, 2008 to Hiew et al. discloses a dual-personality extended USB (EUSB) system which supports both USB and EUSB memory cards using an extended 9-pin EUSB socket. Each EUSB memory card includes a PCBA having four standard USB metal contact pads disposed on an upper side of a PCB, and several extended contact springs that extend through openings defined in the PCB. Passive components are mounted on a lower surface of the PCB using SMT methods, and IC dies are mounted using COB methods, and then the components and IC dies are covered by a plastic molded housing. The extended 9-pin EUSB socket includes standard USB contacts and extended contacts that communicate with the PCBA through the standard USB metal contacts and the contact springs. The PCBA includes dual-personality electronics for USB and EUSB communications. However, the PCBA may be incorrectly plugged into a corresponding connector, as no guiding means or keying means.

Hence, an improved thin card connector is required to overcome the problems of the prior art.

SUMMARY OF THE INVENTION

An object of the present invention is to provide a thin card connector mating with a thin card easily and reliably.

Accordingly, to achieve above-mentioned object, a thin card connector comprises an insulative housing having a bottom wall, a first side wall and a second side wall interconnecting with each other to form a hollow for accommodating a thin card, the bottom wall defining a card supporting surface disposed under the hollow; a plurality of terminals supported by the insulative housing, the terminals divided into a group of first terminals and a group of second terminals, the first terminals having contacting portions extending into the hollow, the second terminals having contacting portions extending into the hollow, the contacting portions of the first contacts located in front of contacting portions of the second terminals; and at least one guiding groove defined in a front segment of the card supporting surface and disposed under the hollow, the guiding groove passing through a front end of the bottom wall to ventilate an exterior.

The detailed features of the present invention will be apparent in the detailed description with appropriate reference to the accompanying drawings.

DETAILED DESCRIPTION OF THE INVENTION

Reference will now be made in detail to the preferred embodiment of the present invention.

Figure 1:
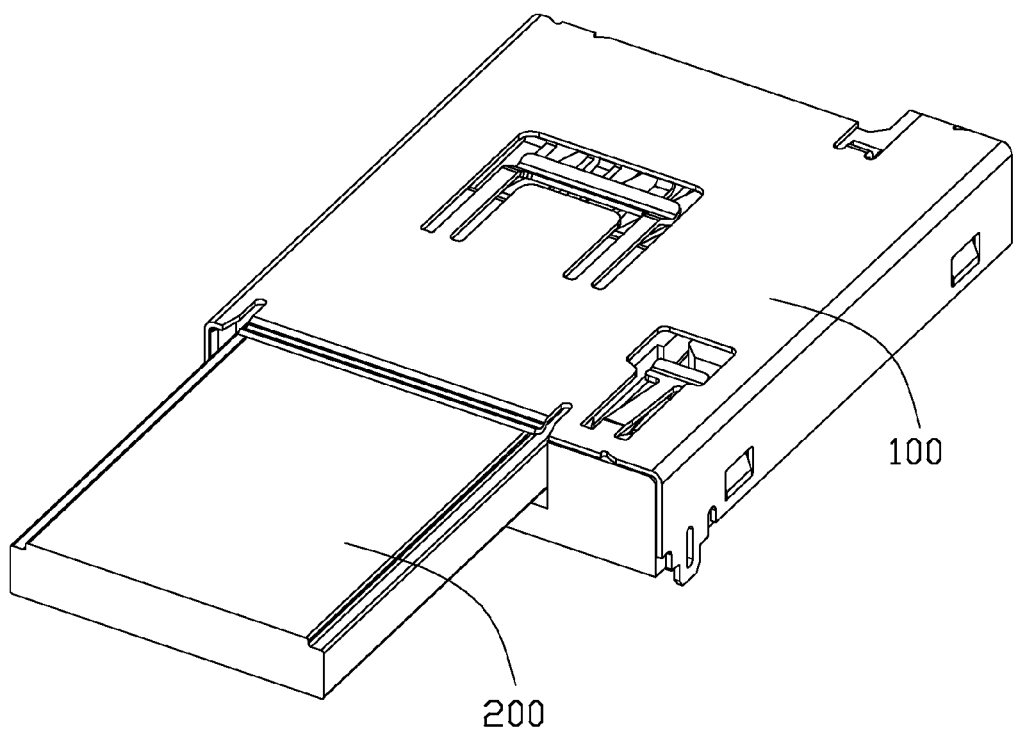
FIG. 1 shows a card mating with a card connector in accordance with the present invention.
Figure 2:
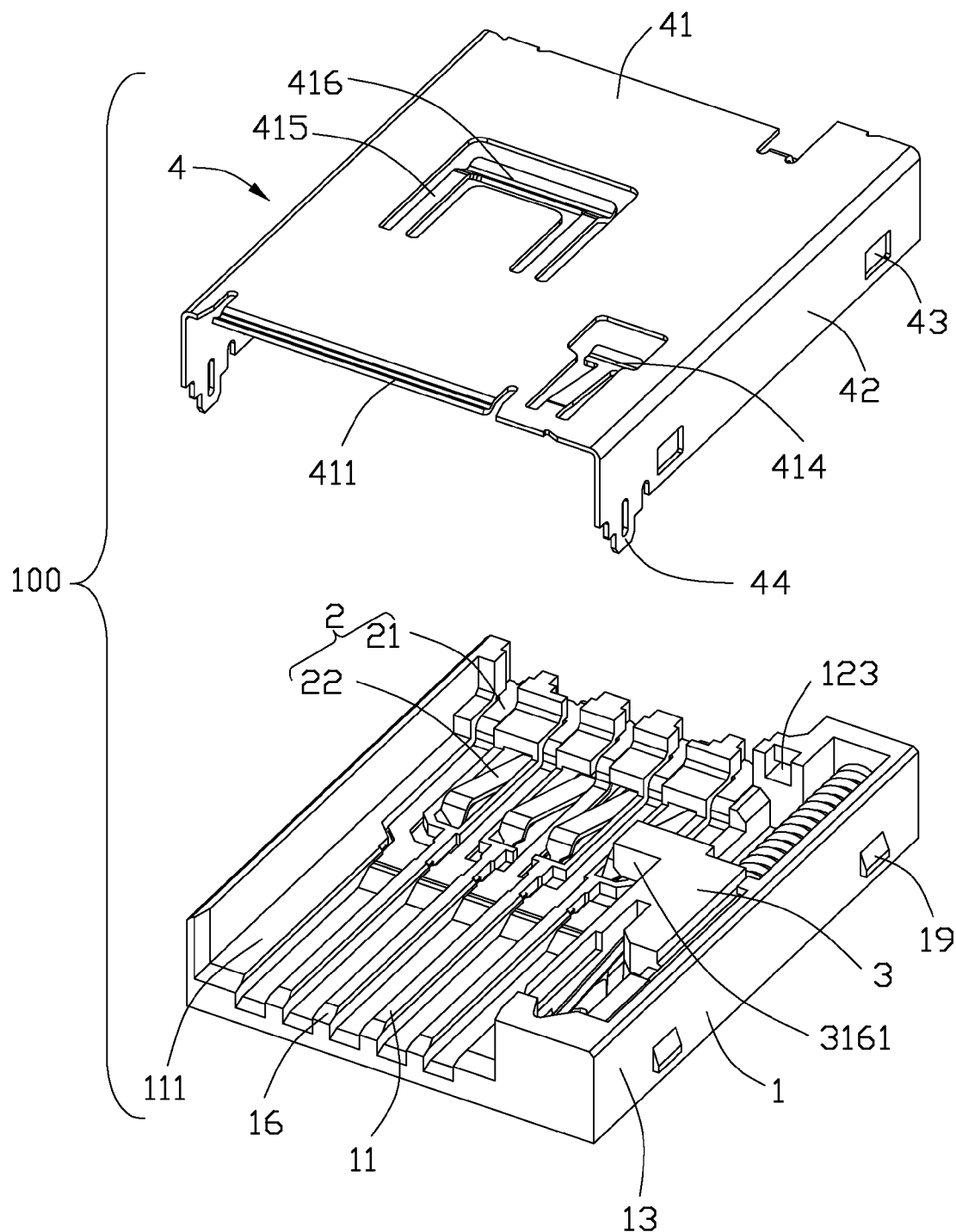
FIG. 2 is a partially exploded, perspective view of the card connector.
Figure 3:
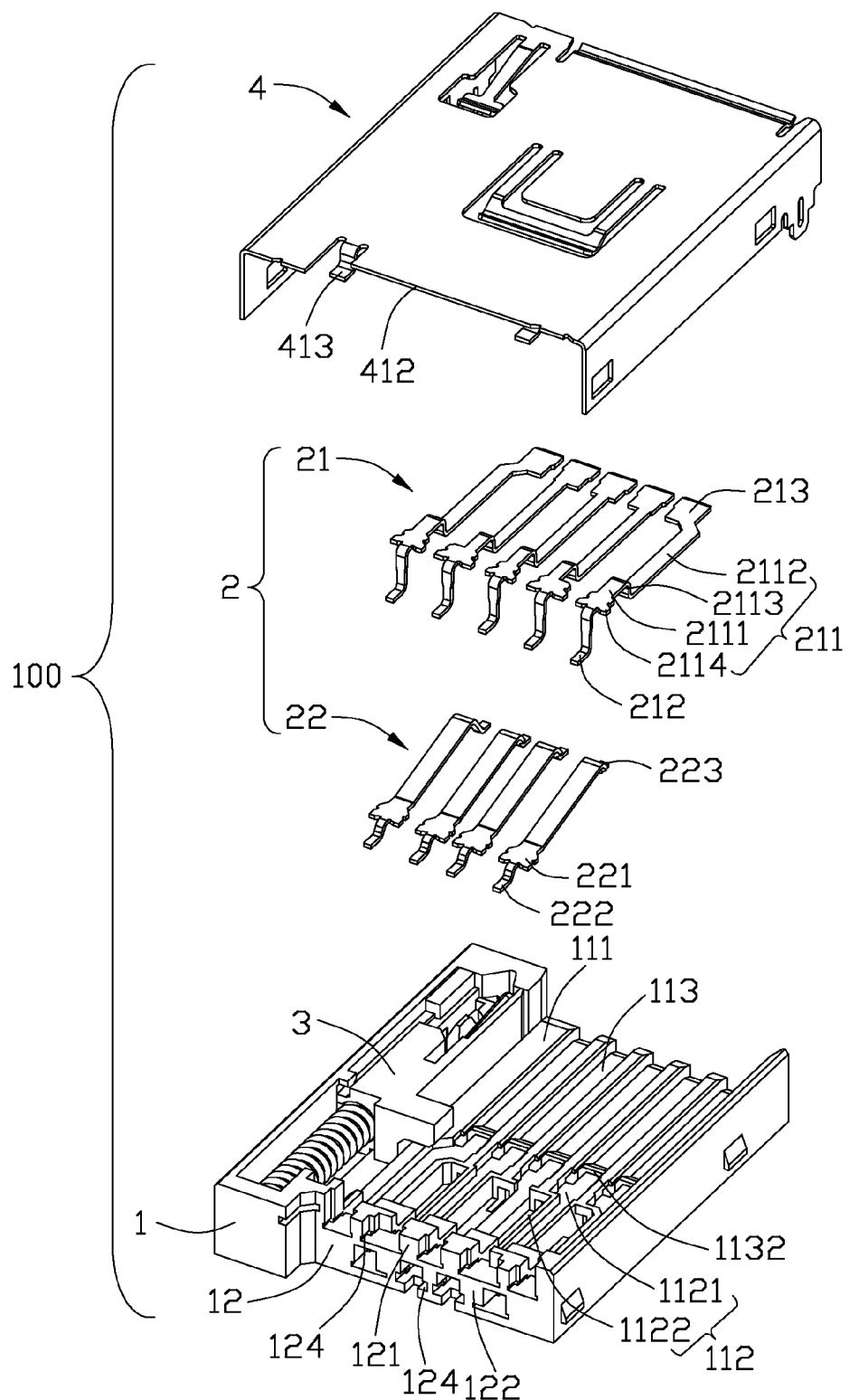
FIG. 3 is an exploded, perspective view of the card connector.
Figure 4:
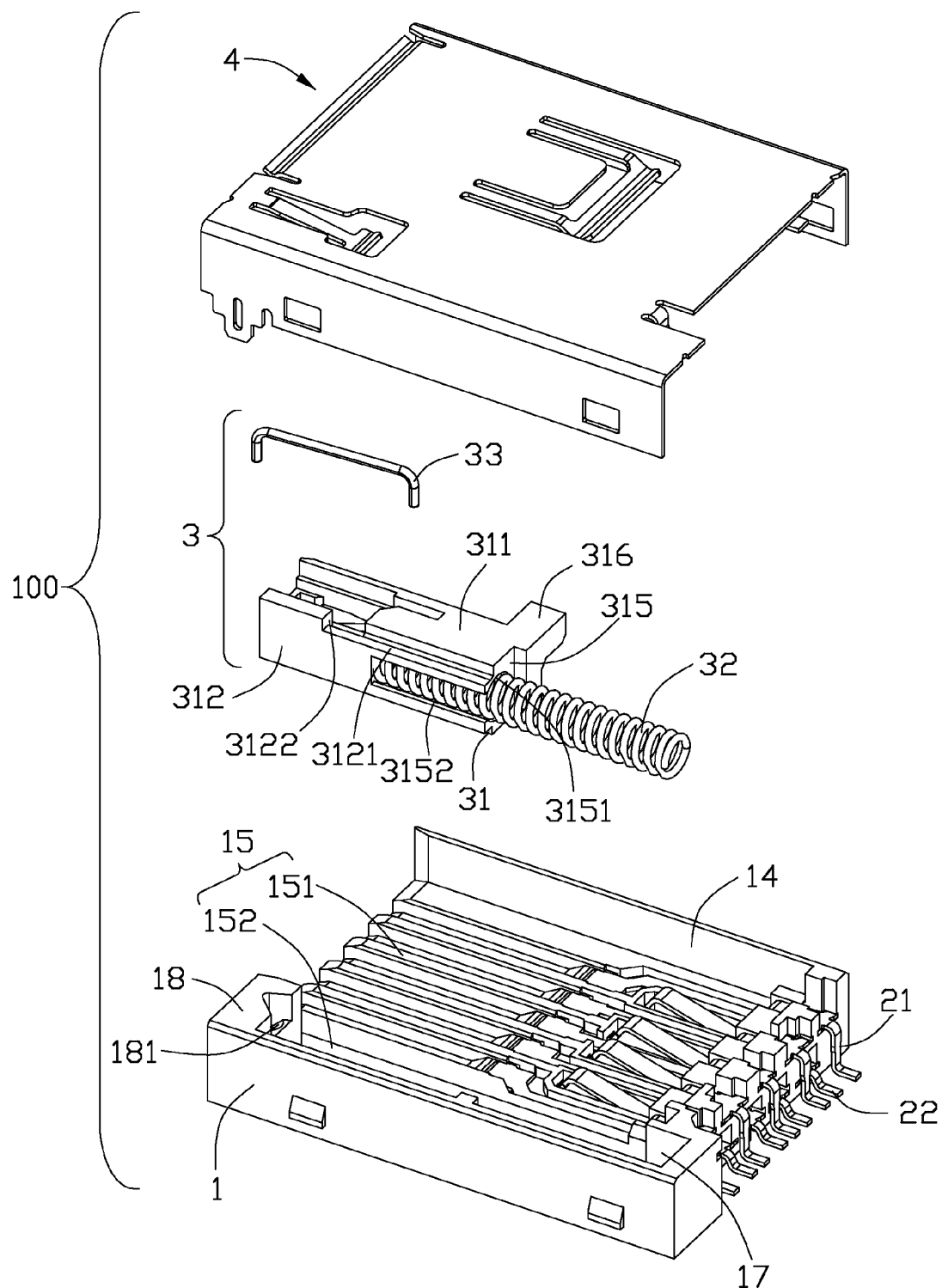
FIG. 4 is another partially exploded, perspective view of the card connector.
Figure 5:
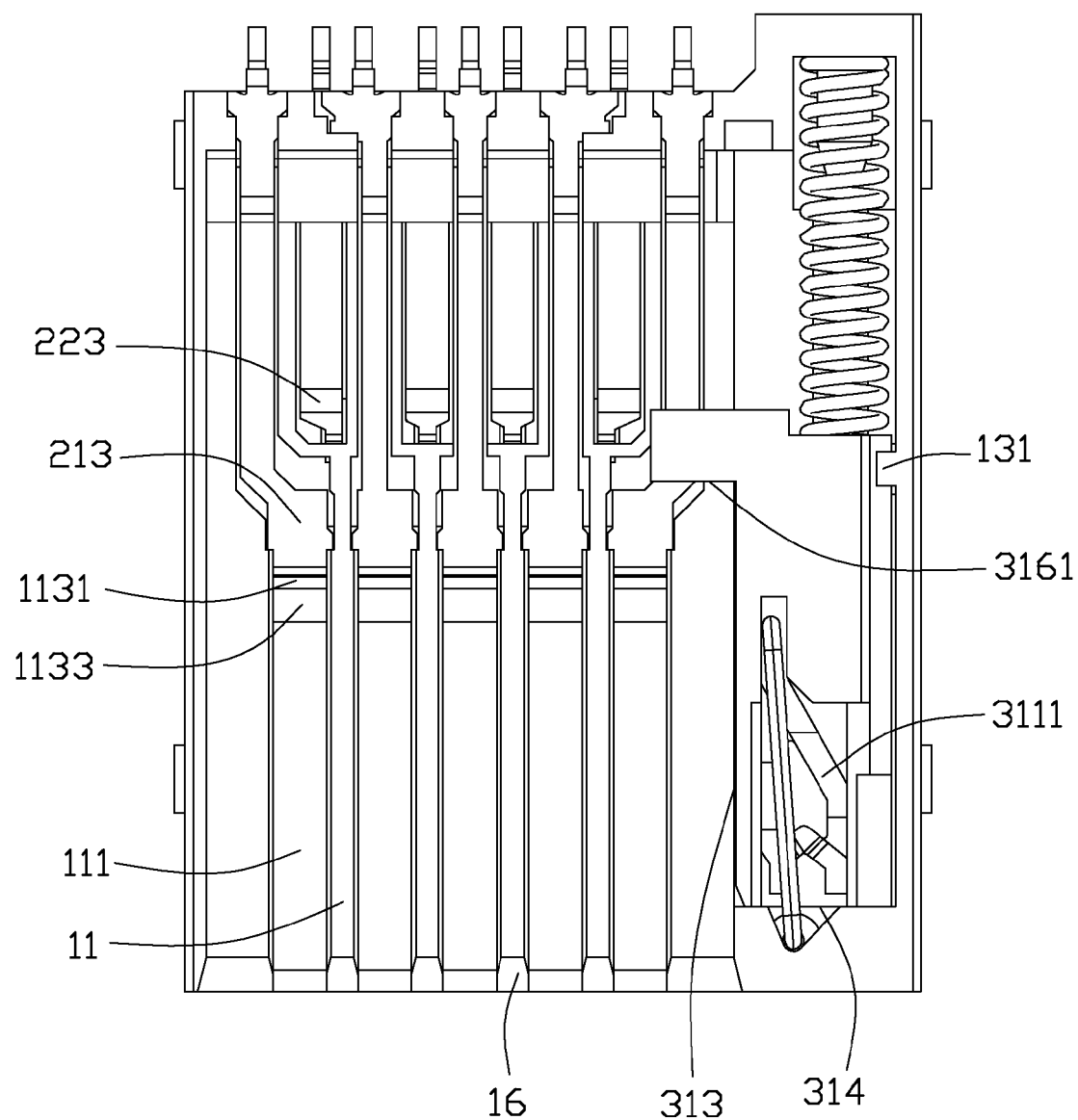
FIG. 5 is a top side view of the card connector, without an outer shell.
Figure 6:
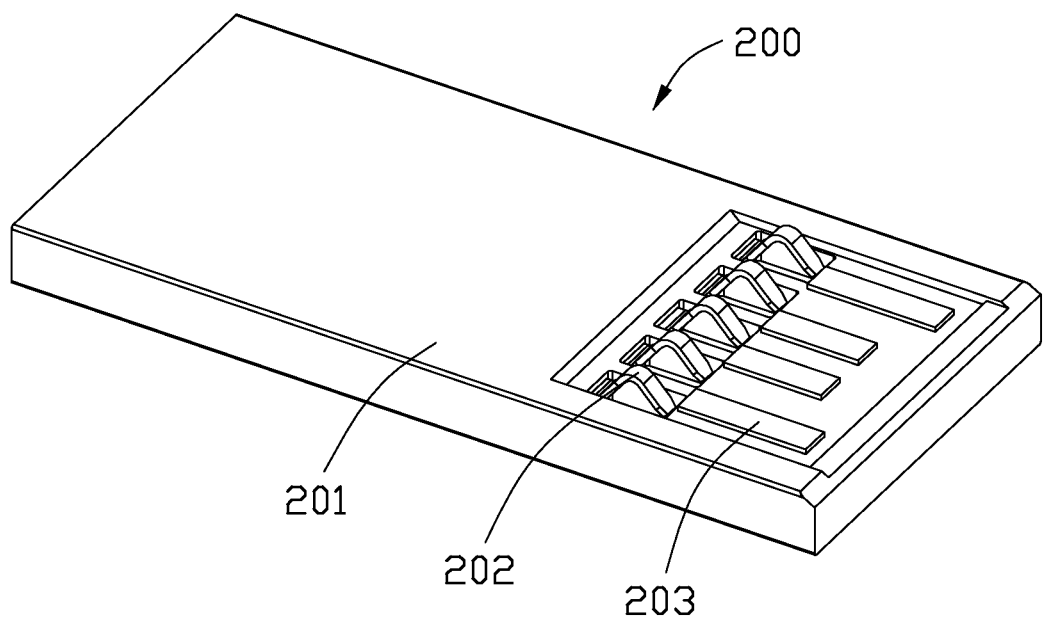
FIG. 6 is a perspective view of the card.

Referring to FIGS. 1-6, a thin card connector 100 is adapted for mating with a USB 3.0 typed thin card 200 in accordance with the present invention. The card connector 100 includes an insulative housing 1, a plurality of terminals 2 supported by the insulative housing 1, a card ejector 3 mounted to the insulative housing 1 and a metallic shell 4 shielding the insulative housing 1.

The insulative housing 1 has a bottom wall 11, a back wall 12 and a first side wall 13 and a second side wall 14 interconnecting with each other to form a hollow 15. The hollow 15 includes a first hollow 151 and a second hollow 152 arranged in juxtaposed manner and communicating with each other. The first hollow 151 is adapted for receiving the card 200 and the second hollow 152 is adapted for receiving the card ejector 3. The hollow 15 has a front opening 16 located around front ends of the bottom wall 11 and the first side wall 13 and the second side wall 14. The bottom wall 11 has a card supporting surface 111 disposed under the hollow 15 and the facing upwardly. There are a number of terminal slots 112 located in a back segment of the card supporting surface 111. The terminal slots 112 are divided into five first terminals slots 1121 and four second terminal slots 1122. The first terminal slots 1121 are divided by the second terminal slots 1122 along a transversal direction. Furthermore, the first terminal slots 1121 and the second terminal slots 1122 are alternated disposed along the horizontal direction. The first terminal slots 1121 are shallower than the second terminal slots 1122. The back wall 12 has an upper section 121 and a lower section 122 along a vertical direction. There are two groups retaining slots 124 respectively defined in the upper section 121 and the lower section 122. The first terminal slots 1121 and the second terminal slots 1122 further communicate with the retaining slots 124, respectively. There are five guiding grooves 113 defined in a front segment of the card supporting surface 111. The guiding grooves 113 ventilate an exterior via passing through the front end of the bottom wall 11. In addition, the guiding grooves 113 align with the first terminal slots 1121 along a front-to-back direction. There is a partition 1131 located between the first terminal slot 1121 and the corresponding guiding groove 113. The partition 1131 further defines an abutting surface 1132 facing toward the first terminal slot 1121 and an inclined guiding surface 1133 facing to the guiding groove 113. There is a retaining cavity 17 defined in a lateral section of the back wall 12 and communicates with the second hollow 152. There is a stopper 18 disposed aside the front opening 16 and located in front of the second hollow 152. A positioning hole 181 defined in the stopper 18 and communicates with the second hollow 152.

The terminals 2 are divided into a group of first terminals 21 and a group of second terminals 22. The first terminals 21 and the second terminals 22 together form an interface for USB 3.0 transmitting. The second terminals 22 alone can form an interface for USB 2.0 transmitting. The first terminals 21 have five terminal members respectively accommodated in the first terminal slots 1121. Each first terminal 21 has a retention portion 211 located in the first terminal slot 1121, a tail portion 212 disposed outward of the first terminal slot 1121, and contacting portion 213 extending into the first hollow 151. The contacting portion 213 is planar shape and completely accommodated in the first terminal slot 1121, thus the contacting portion 213 is disposed under the card supporting surface 111. A front end of the contacting portion 213 abuts against the abutting surface 1132 of the partition 1131. The retention portion 211 has a first retention portion 2111, a second retention portion 2112 and a mediate portion 2113 connecting with the first retention portion 2111 and the second retention portion 2112. The first retention portion 2111 is retained in the retaining slot 124 in the upper section 121 of the back wall 12, with two barbs 2114 thereof interfering with the retaining slot 124. In addition, the first retention portion 2111 is raised with regarding to the second retention portion 2112.

The second terminals 22 has four terminal members respectively accommodated in the second terminal slots 1122. Each second terminal 22 has a retention portion 221 retained in the retaining slot 124, a tail portion 222 disposed outward of the second terminal slot 1122, and contacting portion 223, extending into the first hollow 151. The contacting portion 223 is curved shape and rises upwardly with regarding to the retention portion 221, thus the contacting portion 223 is disposed above the card supporting surface 111. Furthermore, the second terminal slot 1122 is just under the contacting portion 223. The contacting portions 213 of the first terminals 21 and the contacting portions 223 of the second terminals 22 offset from each other along the front-to-back direction.

The card ejector 3 includes a slider 31, a spring member 32 and a follower 33. The slider 31 is mounted to the second hollow 152 and capable of sliding therein along the front-to-back direction. The slider 31 has a top side 311, a first side 312 adjacent to the first side wall 13, a second side 313 opposite to the first side 312, a front side 314 facing to the stopper 18, and a back side 315 opposite to the front side 314. There is a heart-shaped groove 3111 defined in the top side 311. The follower 33 has a first end latch with the heart-shaped groove 3111, and a second end locking into the positioning hole 181 of the stopper 18. There is a circular shaped recess 3151 forwardly recessed from the back side 315, and a rectangular shaped cutout 3152 defined in the first side 312 and communicating with the recess 3151. The spring member 32 has a front segment received in the recess 3151, and an opposite back segment received in the retaining cavity 17. There is a protrusion 316 laterally extending into the first hollow 151. The protrusion 316 has a front side 3161 for cooperating with the card 200. There is a longitudinal notch 3121 defined between the top side 311 and the first side 312. A stop side 3122 is located in the front of the longitudinal notch 3121. A stub 131 is formed on the first side 312 and laterally extends into the longitudinal notch 3121.

The metallic shell 4 is assembled to the insulative housing 1 and shields the first hollow 151 to form a card receiving cavity. The metallic shell 4 includes a top section 41 and two lateral sections 42 projecting downwardly from lateral edges of the top section 41. There are a number of holes 43 defined in the lateral sections 42 engaged with a number of corresponding locking tabs 19 formed on first side wall 13 and second side wall 14 of the insulative housing 1. In addition, there are soldering feet 44 projecting downwardly from the lateral sections 42. The top section 41 has a front edge 411 proximate to the front opening 16 and a back edge 412 proximate to the back wall 12. The front edge 411 tilts upwardly facilitating the inserting of the card 200. There is a tab 413 extending downwardly from the back edge 412 and inserted into a slot 123 in the back wall 12. An elastic arm 414 formed with the top section 41 and extending into the second hollow 152 to press the follower 33. A U-shaped arm 415 formed with the top section 41 and extending into the first hollow 151. The arm 415 further has a curved free end 416 pressing onto and positioning the card 200.

The card 200 has an upper side 201, with a five first contacts and four second contacts arranged in the front of the upper side 201 which are respectively for mating with the first terminals 21 and the second terminals 22. The first contacts have curved contacting portions 202, while the second contacts have planar contacting portions 203 disposed in front of contacting portions 202. When the card 200 mates with the card connector 100, the card 200 is upside down disposed, with the upper side 201 placed on the card supporting surface 111, the first contacting portions 202 moved in the guiding grooves 113 first, then upwardly moving along the inclined guiding surfaces 1133 to reach electrical connecting with the contacting portions 213 of the first terminals 21, also the second contacting portions 203 rides on the contacting portions 223 of the second terminals 22.

While a preferred embodiment in accordance with the present invention has been shown and described, equivalent modifications and changes known to persons skilled in the art according to the spirit of the present invention are considered within the scope of the present invention as described in the appended claims.

What is claimed is:

1. A thin card connector, comprising:
   an insulative housing having a bottom wall, a first side wall and a second side wall interconnecting with each other to form a hollow for accommodating a thin card, the bottom wall defining a card supporting surface disposed under the hollow;
   a plurality of terminals supported by the insulative housing, the terminals divided into a group of first terminals and a group of second terminals, the first terminals having contacting portions which are planar and not deflectable extending into the hollow for contacting with the thin card, the second terminals having contacting portions which are curved and deflectable extending into the hollow, the contacting portions of the first contacts located in front of contacting portions of the second terminals; and
   at least one guiding groove defined in a front segment of the card supporting surface and disposed under the hollow for guiding the thin card, the guiding groove passing through a front end of the bottom wall to ventilate an exterior;
   wherein there are a number of terminal slots located in a back segment of the card supporting surface, and at least one partition located between the terminal slot and the corresponding guiding groove;
   wherein the partition defines an inclined guiding surface facing to the guiding groove and further defines an abutting surface facing toward the first terminal slot; and wherein at least one of the contacting portions of the first terminals abuts against the abutting surface of the partition.

2. The thin card connector as claimed in claim 1, further comprising a metallic shell shielding the insulative housing.

3. The thin card connector as claimed in claim 2, wherein the metallic shell has a top section has a front edge proximate to a front opening of the hollow, and the front edge of the top section tilts upwardly.

4. The thin card connector as claimed in claim 2, wherein there is an arm formed with a top section of the metallic shell and extending into the hollow for pressing onto the thin card.

5. The thin card connector as claimed in claim 2, wherein there is a card ejector accommodated in the hollow.

6. The thin card connector as claimed in claim 5, wherein the card ejector includes a slider, a spring member and a follower.

7. The thin card connector as claimed in claim 6, wherein the slider has a top side, a first side adjacent to the first side wall of the insulative housing, a second side opposite to the first side, a front side facing to a stopper disposed aside a front opening of the hollow, and a back side opposite to the front side.

8. The thin card connector as claimed in claim 7, wherein there is a heart-shaped groove defined in the top side of the slider, and the follower has a first end latch with the heart-shaped groove, and a second end locking into a positioning hole in the stopper.

9. The thin card connector as claimed in claim 8, wherein there is an elastic arm formed with the top section and extending into the hollow to press the follower.

10. A thin card connector adapted for mating with a thin card, comprising:
an insulative housing having a bottom wall, a first side wall and a second side wall interconnecting with each other to form a hollow for accommodating the thin card, the bottom wall defining a card supporting surface disposed under the hollow;
a plurality of terminals supported by the insulative housing, the terminals divided into a group of first terminals and a group of second terminals, the first terminals having planar shape contacting portions extending into the hollow, the second terminals having curved shape contacting portions extending into the hollow, the contacting portions of the first contacts located in front of contacting portions of the second terminals; and
the thin card having a plurality of first contacts for mating with the first terminals and a plurality of second contacts for mating with the second terminals, the first contacts having curved contacting portions, while the second contacts having planar contacting portions disposed in front of the contacting portions of the first contacts;
wherein there are a plurality of guiding grooves defined in a front segment of the card supporting surface and disposed under the hollow, the guiding groove passing through a front end of the bottom wall to ventilate an exterior.

11. The thin card connector as claimed in claim 10, wherein the contacting portions of the first contacts of the thin card moves in the guiding grooves when the thin card is inserted into the hollow of the thin card connector.

12. A thin card connector for use with a thin card, comprising:
an insulative housing defining a card receiving cavity for receiving a thin card therein, and an ejection mechanism receiving cavity beside the card receiving cavity in a transverse direction;
a set of first contacts and a set of second contact alternately disposed in the housing in said transverse direction, the first contacts defining first contact sections which are planar and not deflectable while the second contacts defining second contact sections which are curved and deflectable under condition that the first contact sections are located in front of the second contact section in a front-to-back direction perpendicular to said transverse direction; and
an ejector located in the ejection mechanism receiving cavity and back and forth moveable relative to the housing in the front-to-back direction, said ejector including a slider with a protrusion extending into the card receiving cavity in the transverse direction; wherein
positions of the first contact sections are essentially located at a middle area of the housing in the front-to-back direction, and a position of the protrusion of the slider is essentially located close to but slightly behind the first contact sections for confrontation with a thin card which defines an interface similar to a USB (Universal Serial Bus) 3.0 plug; and wherein
each of the first contacts defines an offset configuration in the transverse direction in a top view, and the housing defines a plurality terminal slots each defining a corresponding offset configuration in the top view for allowing the first contact to be assembled therein to initially in a vertical downward direction and successively forwardly in the front-to-back direction for retaining to the housing.

13. The thin card connector as claimed in claim 12, wherein the housing defines a plurality grooves in front of the first contact sections of the corresponding first contacts, respectively, so as to guide insertion of deflectable counterpart terminals formed on the thin card.

14. The thin card connector as claimed in claim 13, wherein said grooves extend through a front end of the housing to communicate with an exterior for ease insertion of the thin card into the card receiving cavity.

* * * * *